United States Patent
Peng et al.

(10) Patent No.: US 11,569,784 B2
(45) Date of Patent: Jan. 31, 2023

(54) POWER AMPLIFIER CAPABLE OF MAINTAINING CONSTANT GAIN REGARDLESS OF TEMPERATURE VARIATIONS

(71) Applicant: RichWave Technology Corp., Taipei (TW)

(72) Inventors: Tien-Yun Peng, Taipei (TW); Chih-Sheng Chen, Taipei (TW)

(73) Assignee: RichWave Technology Corp., Taipei (TW)

( * ) Notice: Subject to any disclaimer, the term of this patent is extended or adjusted under 35 U.S.C. 154(b) by 6 days.

(21) Appl. No.: 17/356,467

(22) Filed: Jun. 23, 2021

(65) Prior Publication Data

US 2022/0385241 A1      Dec. 1, 2022

Related U.S. Application Data

(60) Provisional application No. 63/195,062, filed on May 31, 2021.

(51) Int. Cl.
*H03F 1/32*      (2006.01)
*H03F 3/20*      (2006.01)

(52) U.S. Cl.
CPC ............ *H03F 1/32* (2013.01); *H03F 3/20* (2013.01); *H03F 2200/165* (2013.01); *H03F 2200/468* (2013.01)

(58) Field of Classification Search
CPC ........ H03F 1/32; H03F 3/20; H03F 2200/165; H03F 2200/468

USPC .......................................... 330/289, 285, 296
See application file for complete search history.

(56) References Cited

U.S. PATENT DOCUMENTS

| | | | |
|---|---|---|---|
| 5,107,389 A | 4/1992 | Botti | |
| 8,441,320 B2 * | 5/2013 | Signoff | H03F 1/30 330/296 |
| 9,020,454 B2 | 4/2015 | Waheed | |
| 9,231,528 B2 * | 1/2016 | Granger-Jones | H03F 1/302 |
| 11,418,150 B2 * | 8/2022 | Cuggino | H03G 1/0035 |
| 2012/0235750 A1 | 9/2012 | Granger-Jones | |
| 2018/0191308 A1 | 7/2018 | Chen | |
| 2018/0262163 A1 | 9/2018 | Tokuda | |
| 2020/0136566 A1 | 4/2020 | Jang | |
| 2020/0373888 A1 | 11/2020 | Scott | |

OTHER PUBLICATIONS

European search report dated May 13, 2022 for the EP application No. 21211548.9, filing date Dec. 1, 2021, pp. 1-9.

\* cited by examiner

*Primary Examiner* — Hieu P Nguyen
(74) *Attorney, Agent, or Firm* — Winston Hsu

(57) ABSTRACT

A power amplifier includes a transistor, a temperature sensor and a filter. The transistor is used to receive a bias signal and amplify a radio frequency (RF) signal. The temperature sensor is arranged in proximity to the transistor, and is used to detect a temperature of the transistor to provide a voltage signal at a control node accordingly. The filter is coupled to the temperature sensor and is used to filter the voltage signal to generate a filtered voltage. The bias signal is adjusted according to the filtered voltage.

19 Claims, 8 Drawing Sheets

POWER AMPLIFIER CAPABLE OF MAINTAINING CONSTANT GAIN REGARDLESS OF TEMPERATURE VARIATIONS

CROSS REFERENCE TO RELATED APPLICATION

This non-provisional application claims priority of U.S. provisional application No. 63/195,062, filed on 31 May, 2021, included herein by reference in its entirety.

TECHNICAL FIELD

The invention relates to temperature compensation of a power amplifier, and in particular, to a radio frequency power amplifier capable of maintaining a constant gain regardless of temperature variations.

BACKGROUND

Power amplifiers (PA) are used in virtually all electronic devices, particularly in radio frequency (RF) devices such as smartphones, WiFi hotspots and other wireless devices. A power amplifier converts a low power RF signal into a high power RF signal. When in operation, the power amplifier will continue to warm up by a current flowing therethrough, the heat generated by the power amplifier will reduce the gain, degrading the linearity and signal quality. Since the heat may be accumulated with time, the degradation of the linearity and signal quality is particularly visible during transmission of long-frame data.

Therefore, a power amplifier capable of maintaining a substantially constant gain regardless of the heat generated inside and/or outside of the power amplifier is in need.

SUMMARY

According to an embodiment of the invention, a power amplifier includes a transistor, a temperature sensor and a filter. The transistor is used to receive a bias signal and amplify a radio frequency (RF) signal. The temperature sensor is arranged in proximity to the transistor, and is used to detect a temperature of the transistor to provide a voltage signal at a control node accordingly. The filter coupled to the temperature sensor and is used to filter the voltage signal to generate a filtered voltage. The bias signal is adjusted according to the filtered voltage.

DETAILED DESCRIPTION

Figure 1:
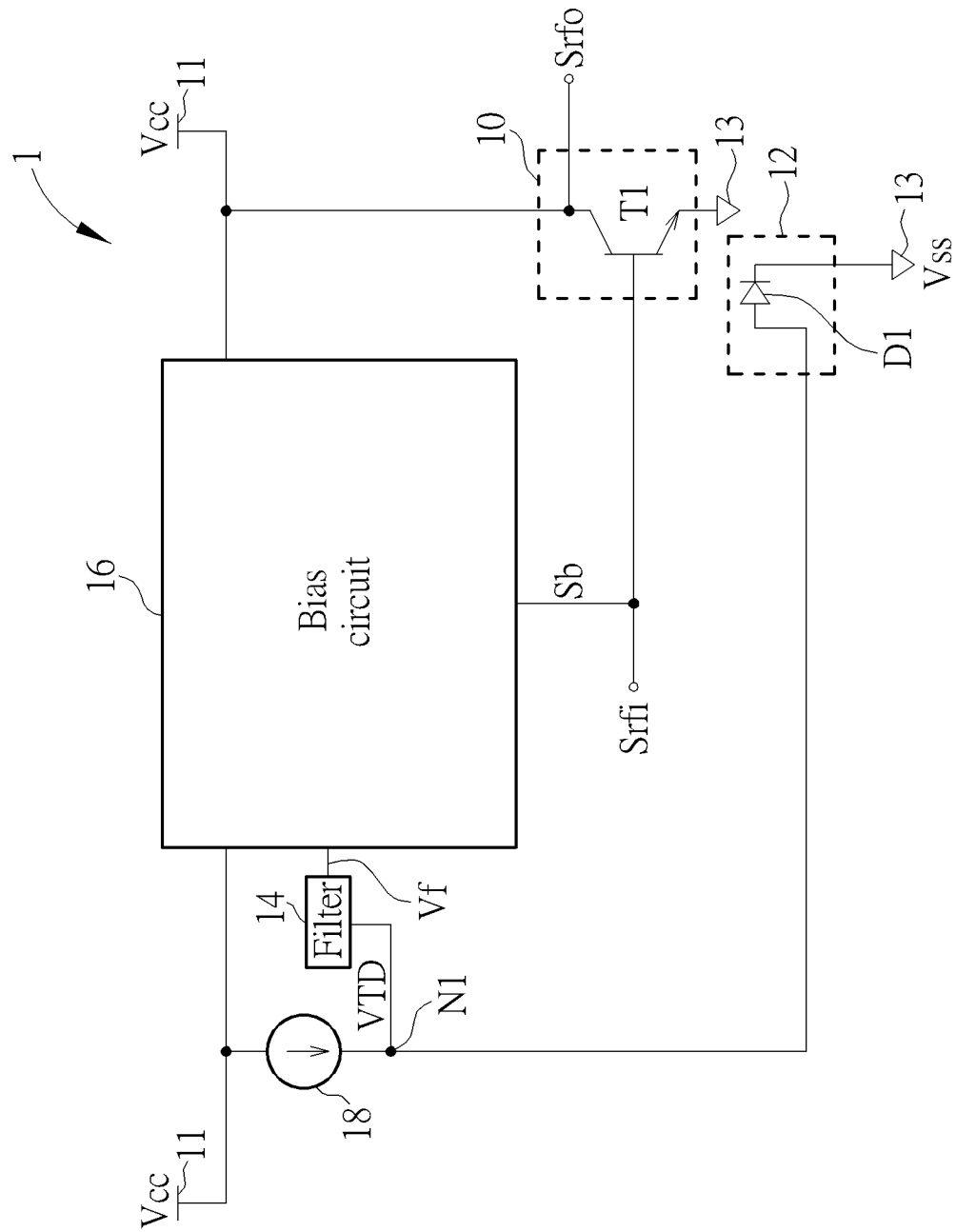
FIG. 1 is a block diagram of a power amplifier according to an embodiment of the invention.

Below, exemplary embodiments will be described in detail with reference to accompanying drawings so as to be easily realized by a person having ordinary knowledge in the art. The inventive concept may be embodied in various forms without being limited to the exemplary embodiments set forth herein. Descriptions of well-known parts may be omitted for clarity, and like reference numerals refer to like elements throughout.

FIG. 1 is a block diagram of a power amplifier 1 according to an embodiment of the invention. The power amplifier 1 may maintain a substantially constant gain over time to offset the effect of a temperature variation owing to self-heating of the power amplifier 1. Furthermore, the power amplifier 1 may preprocess a temperature detection signal representative of the temperature of the power amplifier 1 to enhance accuracy and speed of temperature compensation, thereby increasing linearity and signal quality of the power amplifier 1.

The power amplifier 1 may include an amplifier stage 10, a temperature sensor 12, a filter 14, a bias circuit 16 and a current source 18. The amplifier stage 10 may include a transistor T1. The temperature sensor 12 may be arranged in proximity to the amplifier stage 10, specifically, to the transistor T1. The transistor T1 may be a bipolar junction transistor (BJT) such as a heterojunction bipolar transistor (HBT). In some embodiments, the temperature sensor 12 may be arranged immediately next to the transistor T1. The temperature sensor 12 is coupled to the filter 14, the filter 14 is coupled to the bias circuit 16, and the bias circuit 16 is coupled to the transistor T1. The temperature sensor 12 may include a diode D1 including a first terminal, and a second terminal coupled to a reference terminal 13. The first terminal of the diode D1 may be an anode, and the second terminal of the diode D1 may be a cathode. The current source 18 includes a first terminal coupled to a reference terminal 11, and a second terminal coupled to the first terminal of the diode D1. The transistor T1 includes a first terminal coupled to the reference terminal 11, a second terminal coupled to the reference terminal 13, and a control terminal coupled to the bias circuit 16 and configured to receive a bias signal Sb and an input radio frequency (RF) signal Srfi. The reference terminal 11 may provide a supply voltage Vcc, e.g., 3.3V, and the reference terminal 13 may provide a ground voltage or a common voltage Vss, e.g., 0V.

The transistor T1 may receive the input RF signal Srfi and the bias signal Sb, and amplify the power of the input RF signal Srfi to generate an output RF signal Srfo. The bias signal Sb may be a current signal or a voltage signal. In one embodiment, for example, the bias signal Sb is a current signal. The temperature sensor 12 may detect a temperature of the transistor T1 to provide a voltage signal VTD at a control node N1 accordingly. The current source 18 may supply a constant current to the diode D1. The diode D1 operated at the constant current serves as a complementary to absolute temperature (CTAT) device, and the voltage across the diode D1 decreases with an increasing temperature, resulting in a decreasing voltage signal VTD. Therefore, the voltage signal VTD may represent the temperature of the power amplifier 1. In some embodiments, the diode D1 may establish the voltage signal VTD at a default level at a predetermined temperature. For example, the default level of the voltage signal VTD may be 1.2V at a predetermined temperature of 25 degrees Celsius, and the voltage signal VTD may be 1.1V at a temperature of 100 degrees Celsius, and 1.3V at a temperature of −50 degrees Celsius. In some embodiments, the diode D1 may be replaced by a bipolar junction transistor (BJT) such as an HBT. The BJT may be diode connected or biased into an operating region, such as the saturation region. The filter 14 may be a low pass filter filtering the voltage signal VTD to generate a filtered voltage Vf. The bias circuit 16 may generate the bias signal Sb according to the filtered voltage Vf and provide the bias signal Sb to the transistor T1. When the power amplifier 1 performs a data transmission, the bias signal Sb may be adjusted to maintain the gain at a substantially constant level. For example, the bias signal Sb may be increased with an increasing temperature to maintain a substantially constant gain. Further, the current source 18 may also supply a current to the bias circuit 16.

In order to obtain an accurate temperature reading from the transistor T1, the temperature sensor 12 is placed in the proximity to the transistor T1. However, the close distance between the transistor T1 and the temperature sensor 12 results in increased signal coupling from the transistor T1 to the temperature sensor 12, introducing a high-frequency noise into the voltage signal VTD. The high-frequency noise may correspond to the frequency of the output RF signal Srfo. For example, when the output RF signal Srfo is a WiFi signal, the high-frequency noise may be of 5 GHz. In addition, the diode D1 may be turned on by the signal coupled from the transistor T1, resulting in voltage clipping in the voltage signal VTD. The voltage clipping may introduce a low-frequency noise into the output RF signal Srfo via the bias signal Sb. For example, the low-frequency noise may be of 80 MHz and/or 160 MHz. Both the high-frequency and low-frequency noises can lead to an inaccurate or even a false temperature compensation, and may result in a degradation of an error vector magnitude (EVM) or dynamic error vector magnitude (DEVM) of the output RF signal Srfo.

Figure 2:
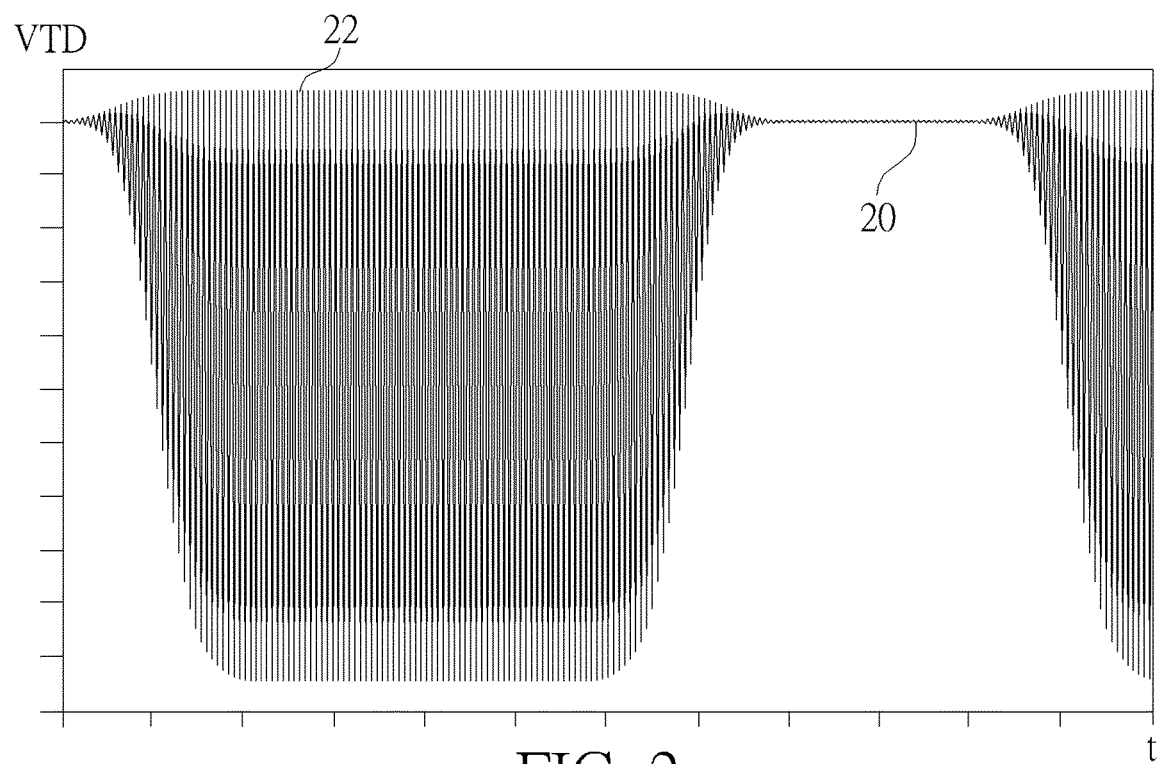
FIG. 2 shows a waveform of the voltage signal in FIG. 1.
Figure 3:
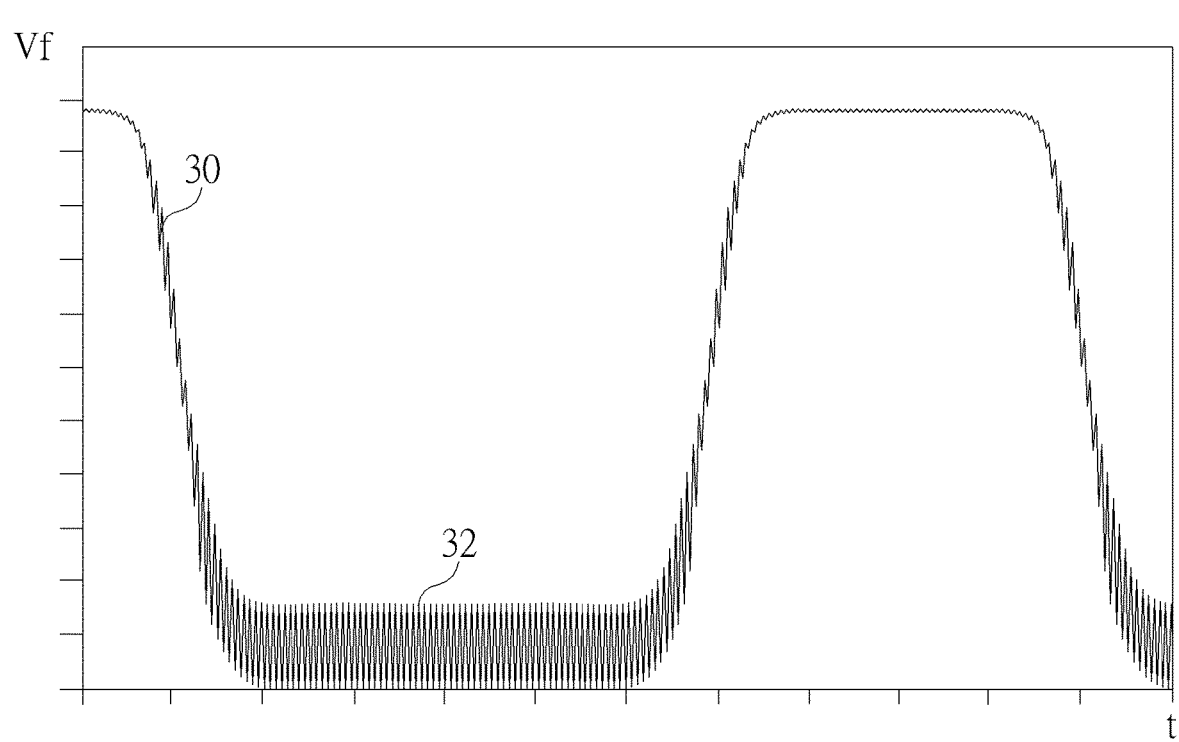
FIG. 3 shows a waveform of the filtered voltage in FIG. 1.

The filter 14 may filter out the noise from the voltage signal VTD in a thorough and prompt manner, so as to reduce the noise from affecting the bias signal Sb. FIGS. 2 and 3 respectively show waveforms of the voltage signal VTD and the filtered voltage Vf of the power amplifier 1. The voltage signal VTD is fed into the filter 14, and the filtered voltage Vf is output from the filter 14. FIG. 2 shows that the voltage signal VTD includes an envelope 20 and a carrier 22, and FIG. 3 shows that the filtered voltage Vf includes an envelope 30 and a filtered carrier 32. The envelopes 20 and 30 are substantially identical. The filtered carrier 32 is less than the carrier 22 in both the noise levels and components. That is to say, the higher frequency components of the carrier 22 are attenuated or removed, resulting in the filtered carrier 32 in the filtered voltage Vf.

Figure 4:
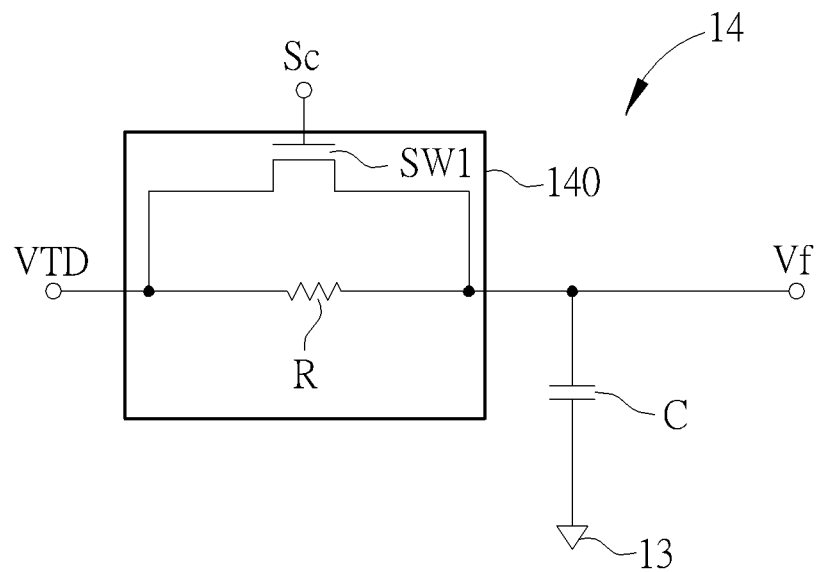
FIG. 4 is a circuit schematic of the filter in FIG. 1.

The filter 14 may include an RC circuit represented by the circuit schematic in FIG. 4. The filter 14 includes a resistor R and a capacitor C coupled thereto. The filter 14 may further include a variable impedance component 140, including the resistor R, coupled with the capacitor C. The variable impedance component 140 may include a first terminal configured to receive the voltage signal VTD, and a second terminal configured to output the filtered voltage Vf. The capacitor C includes a first terminal coupled to the second terminal of the variable impedance component 140, and a second terminal coupled to the reference terminal 13.

The variable impedance component 140 may be adjusted according to a control signal Sc to at least provide a first impedance in a first interval, and a second impedance in a second interval. For example, the second impedance may be greater than the first impedance. In FIG. 4, the variable impedance component 140 may include a switch SW1 and the resistor R coupled in parallel thereto.

When the switch SW1 is turned on, the variable impedance component 140 may provide the first impedance, and when the switch SW1 is turned off, the variable impedance component 140 may provide the second impedance. The first impedance may substantially equal to 0 ohms, and the second impedance may substantially equal to the resistance of the resistor R. A product of the resistance of the resistor R and a capacitance of the capacitor C is referred to as a time constant. A larger time constant may lead to removal of lower frequency components and slower circuit response. The resistance of the resistor R and/or the capacitance of the capacitor C may be configured to be relatively large to filter out the low-frequency noise as well as the high-frequency noise from the voltage signal VTD. The switch SW1 may be turned on in the first interval to speed up the circuit response of the filter 14 and set the filtered voltage Vf to an operating level quickly. The operating level of the filtered voltage Vf may be 1.2V. The switch SW1 may be turned off in the second interval to suppress the low-frequency noise. The first interval may be a brief time interval starting upon a data transmission. For example, the first interval may be 0 to 400 ns of the data transmission. The second interval may be a longer time interval starting immediately after the first interval. For example, the second interval may 400 ns till the end of the data transmission. In this manner, the filter 14 may set the filtered voltage Vf at the operating level promptly while delivering an accurate temperature signal.

In some embodiments, the resistor R in the variable impedance component 140 may be replaced with an inductor. Similar to the RC filter 14, a product of an inductance of the inductor and a capacitance of the capacitor C is referred to as a time constant in an LC filter. The operation of the LC filter is similar to that of the RC filter 14, the explanation therefore may be omitted for brevity.

Figure 5:
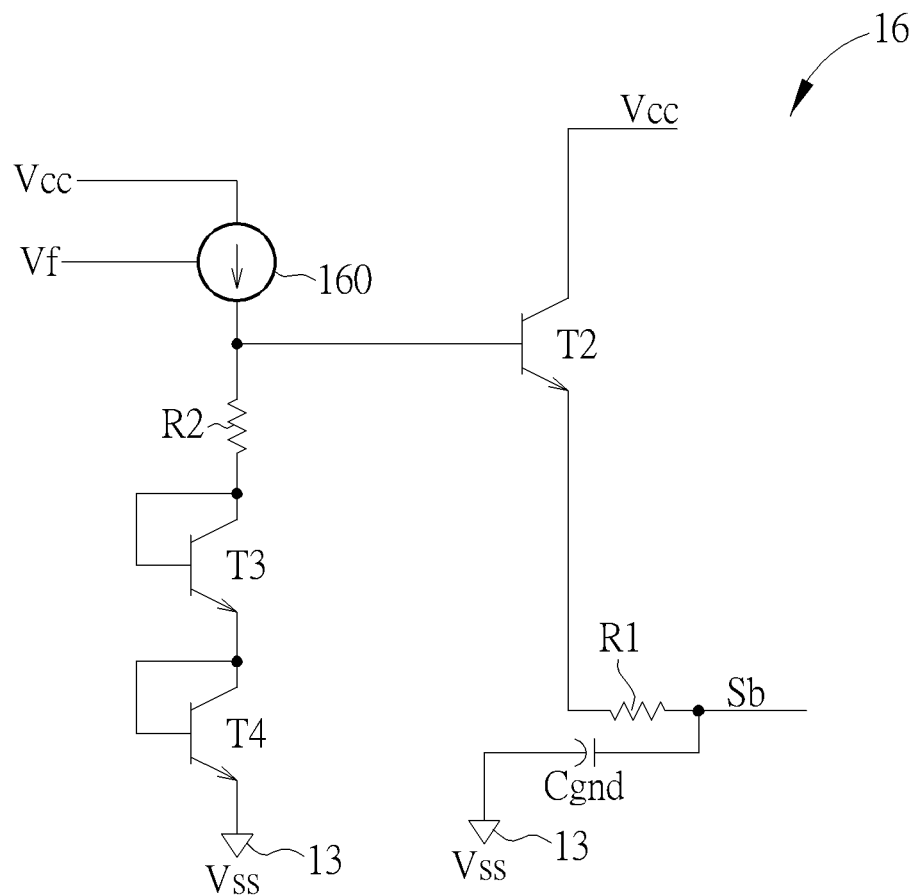
FIG. 5 is a circuit schematic of the bias circuit in FIG. 1.

FIG. 5 is a circuit schematic of the bias circuit 16. The bias circuit 16 may include a current source 160, transistors T2 to T4, resistors R1 and R2, and a capacitor Cgnd. The current source 160 may be a BJT or a field effect transistor (FET). The current source 160 comprises a first terminal configured to receive the supply voltage Vcc, a second terminal, and a control terminal configured to receive the filtered voltage Vf. The transistor T2 includes a first terminal configured to receive the supply voltage Vcc, a second terminal and a control terminal. The resistor R2 includes a first terminal coupled to the control terminal of the transistor T2 and the second terminal of the current source 160, and a second terminal. The transistor T3 includes a first terminal coupled to the second terminal of the resistor R2, a second terminal, and a control terminal coupled to the first terminal of the transistor T3. The transistor T4 includes a first terminal coupled to the second terminal of the transistor T3, a second terminal coupled to the reference terminal 13 and a control terminal coupled to the first terminal of the transistor T4. The resistor R1 includes a first terminal coupled to the second terminal of the transistor T2, and a second terminal. The capacitor Cgnd, such as a grounding capacitor, includes a first terminal coupled to the second terminal of the resistor R1, and a second terminal coupled to the reference terminal 13.

The current source 160 may generate a variable current according to the filtered voltage Vf. The magnitude of the variable current may be negatively correlated to that of the filtered voltage Vf. When the temperature of the power amplifier 1 increases, the filtered voltage Vf will decrease, and the variable current will be increased accordingly, increasing the bias signal Sb. When the temperature of the power amplifier 1 decreases, the filtered voltage Vf will increase, and the variable current will be decreased accordingly, decreasing the bias signal Sb.

Figure 6:
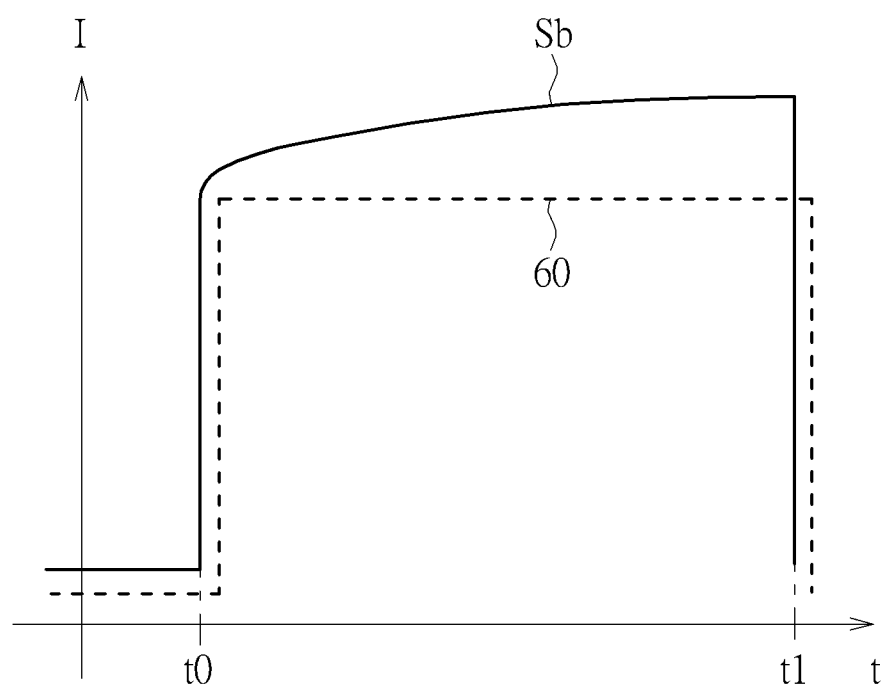
FIG. 6 shows waveforms of the power amplifier in FIG. 1.

FIG. 6 shows waveforms of the bias signal Sb and the gain 60 of the power amplifier 1, where x-axis represents time t and y-axis represents current I. At t0, the power amplifier 1 starts to perform a data transmission, the bias signal Sb starts at an initial current level to drive the gain to a predetermined level. Between Time t0 and t1, the power amplifier 1 continues to heat up, the bias signal Sb increases to maintain the gain 60 at the predetermined level. After Time t1, the data transmission is completed, both the bias signal Sb and the gain 60 drop to low levels. FIG. 6 shows that the temperature compensation can result in a relatively flat gain 60 over the entire duration of the data transmission, increasing the linearity and the signal quality of the power amplifier 1.

Figure 7:
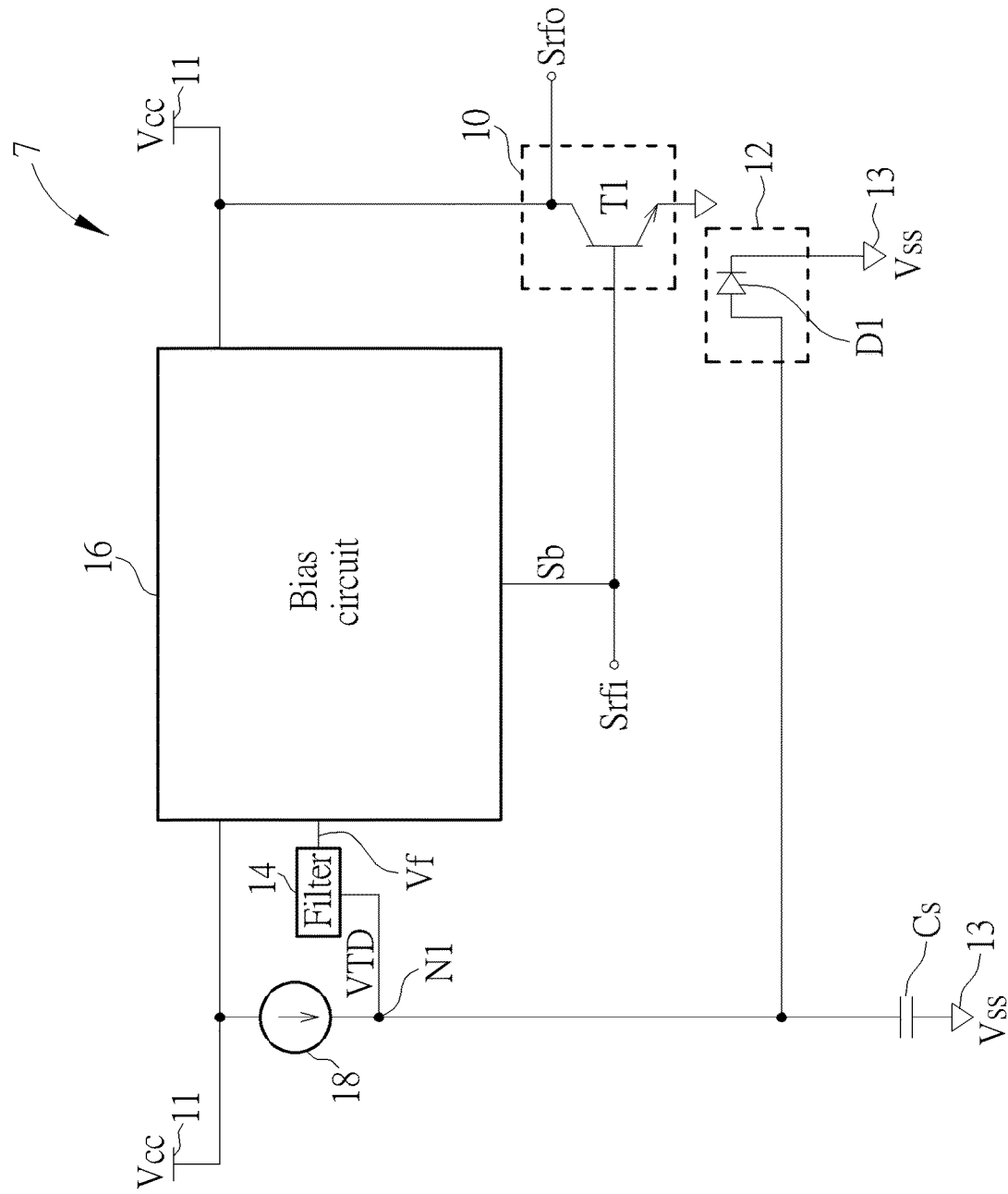
FIG. 7 is a block diagram of a power amplifier according to another embodiment of the invention.

FIG. 7 is a block diagram of a power amplifier 7 according to another embodiment of the invention. The power amplifier 7 is different from the power amplifier 1 in further including a shunt capacitor Cs. The shunt capacitor Cs is arranged between the control node N1 and the reference terminal 13. The shunt capacitor Cs includes a first terminal coupled to first terminal of the diode D1, and a second terminal coupled to the reference terminal 13. The shunt capacitor Cs is coupled in parallel to the temperature sensor 12, and may be arranged in proximity to the transistor T1, the temperature sensor 12 and a through silicon via (TSV). The through silicon via serves as a grounding connection. The shunt capacitor Cs may be placed immediately next to the transistor T1, the temperature sensor 12 and the through silicon via to direct the high-frequency noise to the ground, further reducing the noise in the voltage signal VTD.

The power amplifier 7 may adopt the shunt capacitor Cs in close proximity to the transistor T1, the temperature sensor 12 and the through silicon via to further remove the high-frequency noise from the voltage signal VTD, thereby enhancing accuracy of the temperature compensation, and increasing linearity and signal quality of the power amplifier 7.

Figure 8:
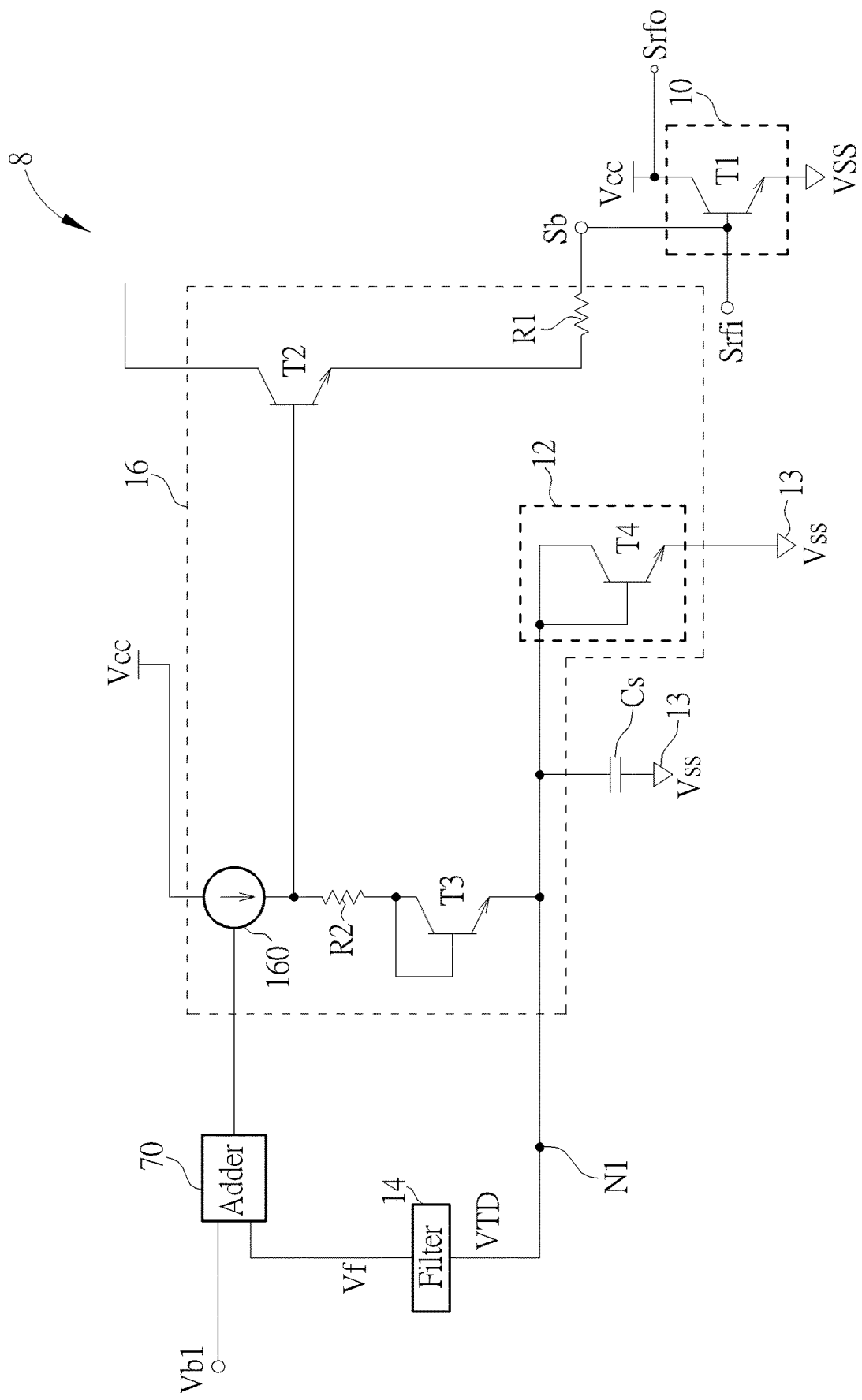
FIG. 8 is a block diagram of a power amplifier according to another embodiment of the invention.

FIG. 8 is a block diagram of a power amplifier 8 according to another embodiment of the invention. The power amplifier 8 is different from the power amplifier 7 in utilizing the transistor T4 for temperature sensing with the diode D1 omitted, and further including an adder 70. The bias circuit 16 includes the temperature sensor 12, and may generate the bias signal Sb according to the variable current generated by the current source 160. The first terminal and the control terminal of the transistor T4 are further coupled to the first terminal of the shunt capacitor Cs and to the filter 14. The adder 70 includes a first input terminal configured to receive a bias voltage Vb1, a second input terminal coupled to the filter 14 and configured to receive the filtered voltage Vf, and an output terminal coupled to the control terminal of the current source 160. The bias voltage Vb1 may be adapted according to the power and/or the frequency of the input RF signal Srfi. The filtered voltage Vf may correspond to the temperature of the power amplifier 8. The adder 70 may add the bias voltage Vb1 and the filtered voltage Vf to generate a control voltage representing a variation of the power and/or the frequency of the input RF signal Srfi and a variation of the temperature of the power amplifier 8. In turn, the current source 160 may receive the control voltage to generate the variable current for controlling the transistor T2 to generate the bias signal Sb. In this manner, the bias signal Sb may be adapted according to the power and/or the frequency of the input RF signal Srfi and the temperature of the power amplifier 8, so as to maintain a substantially constant gain of the power amplifier 8. In some embodiments, the adder 70 may be removed from the power amplifier 8, and the filter 14 may be coupled to current 160 directly. The transistor T4 may be arranged in proximity to the transistor T1 to detect the temperature thereof. The configuration and operation of other components in the power amplifier 8 are similar to those in the power amplifier 7, and the explanation therefore will be omitted for brevity.

In comparison to the power amplifier 7, the power amplifier 8 reuses the diode-connected transistor T4 of the bias circuit 16 for temperature sensing, saving the circuit area while maintaining the gain at a substantially constant level over time.

Figure 9:
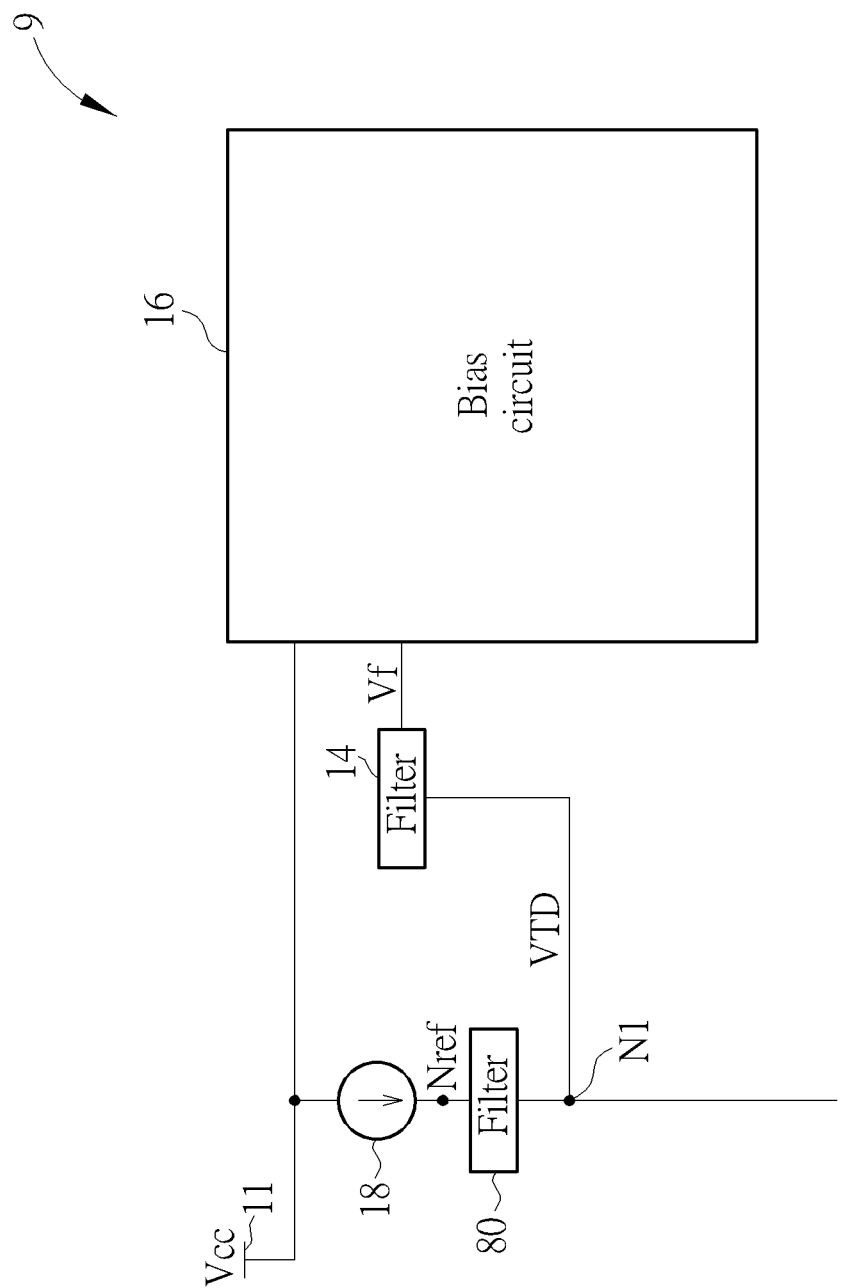
FIG. 9 is a block diagram of a power amplifier portion according to another embodiment of the invention.

FIG. 9 is a block diagram of selected circuits of a power amplifier 9 according to another embodiment of the invention. The power amplifier 9 is different from the power amplifier 1 in further including a filter 80 and a reference node Nref. The reference node Nref is coupled to the current source 18. In some embodiments, the current source 18 may be replaced with a voltage source. The filter 80 is coupled between the reference node Nref and the control node N1, and may filter out the noise from the voltage signal VTD to prevent the noise from affecting the current source 18. The configuration and operation of other components in the power amplifier 9 are similar to those in the power amplifier 1, and the explanation therefore will be omitted for brevity.

The power amplifier 9 adopts the filter 80 to isolate the current source 18 from the unwanted noise.

Figure 10:
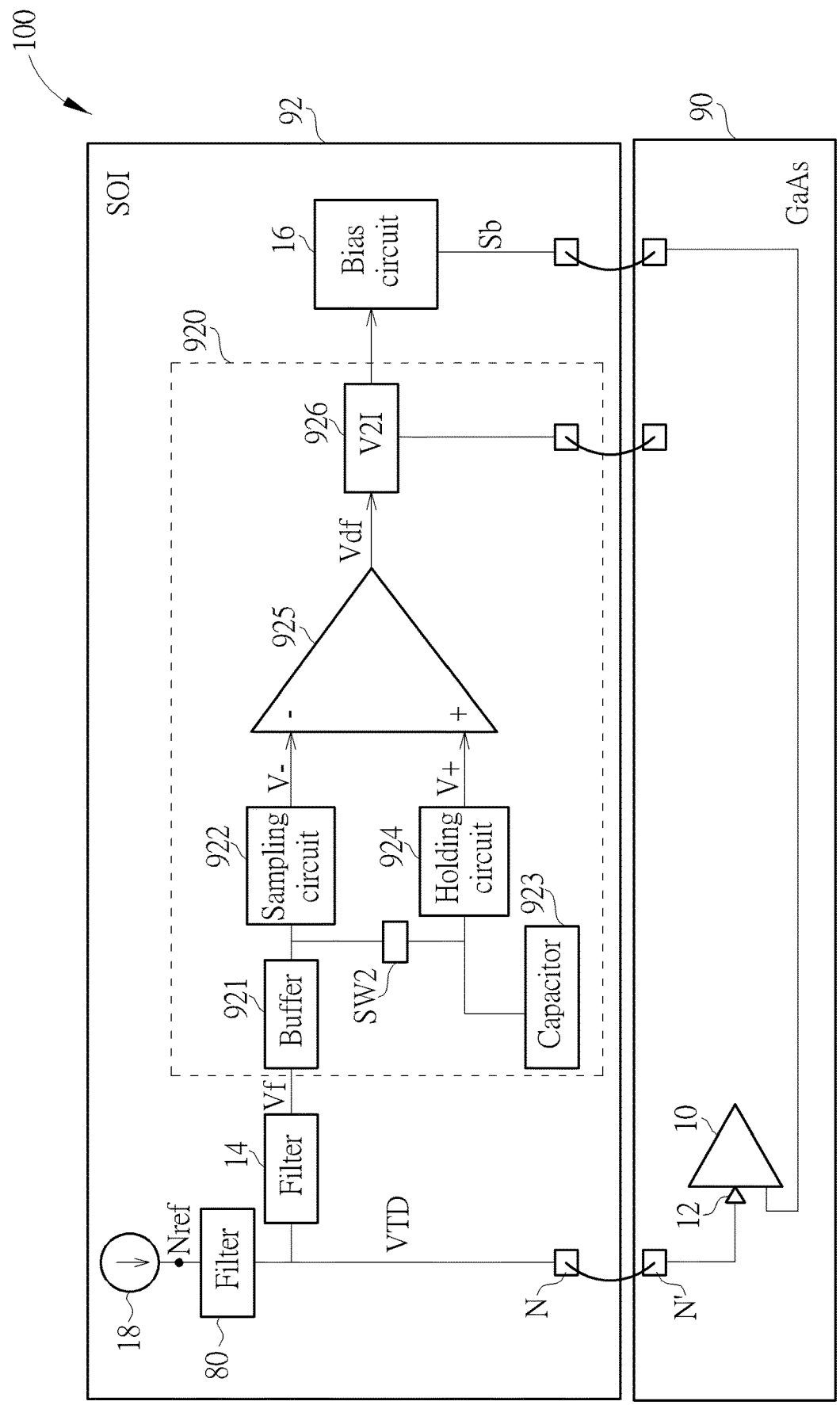
FIG. 10 is a block diagram of a power amplifier according to another embodiment of the invention.

FIG. 10 is a block diagram of a power amplifier 100 according to another embodiment of the invention. The power amplifier 100 is different from the power amplifier 1 in further including a sample-and-hold circuit 920. The sample-and-hold circuit 920 may include a buffer 921, a sampling circuit 922, a switch SW2, a capacitor 923, a holding circuit 924, a differential amplifier 925 and a voltage-to-current (V2I) converter 926. The buffer 921 is coupled to the filter 14. The sampling circuit 922 and the switch SW2 are coupled to the buffer 921. The capacitor 923 and the holding circuit 924 are coupled to the switch SW2. The differential amplifier 925 includes a first input terminal coupled to the sampling circuit 922, a second input terminal coupled to the holding circuit 924, and an output terminal coupled to the voltage-to-current (V2I) converter 926. The first input terminal may be an inverting terminal, and the second input terminal may be a non-inverting terminal. The V2I converter 926 may be coupled to the bias circuit 16.

The buffer 921 may be a buffer amplifier holding the filtered voltage Vf. The sampling circuit 922 may sample the filtered voltage Vf at regular intervals to generate an updated voltage V−. The switch SW2 may be operated by a timing different from that of the switch SW1 (as shown in FIG. 4) in the filter 14. The capacitor 923 may be used to store an initial voltage V+. The holding circuit 924 may maintain the initial voltage V+ at the capacitor 923. In some embodiments, the holding circuit 924 may refresh and maintain the initial voltage V+ at the capacitor 923 at regular intervals. The differential amplifier 925 may generate a difference voltage Vdf according to a difference between the initial voltage V+ and the updated voltage V−, and output the difference voltage Vdf to the voltage-to-current converter 926. The voltage-to-current converter 926 may convert the difference voltage Vdf into a difference current, and the bias circuit 16 may generate the bias signal Sb according to the difference current.

The switch SW2 may be turned on for a predetermined duration upon power-up of the power amplifier 100, and may be turned off since then. The predetermined duration may be 10 microseconds or less. During the predetermined duration after power-up, the temperature of the power amplifier 100 may be almost unchanged or so little changed that it may be substantially stable. For example, the switch SW2 may be turned on for 4 ms upon power-up, and turned off since then. Upon the switch SW2 being turned on, the capacitor 923 may be charged to an initial voltage V+ equal to the filtered voltage Vf during the predetermined duration. For example, the initial voltage V+ may be 1.12V. The holding circuit 924 may transmit the initial voltage V+ to the second input terminal of the differential amplifier 925. Meanwhile, the sampling circuit 922 may sample the filtered voltage Vf to generate an updated voltage V−. Since the initial voltage V+ is equal to the voltage V−, the differential amplifier 925 may generate a difference voltage Vdf substantially equal to 0V. That is, the power amplifier 100 does not perform a temperature compensation at this stage.

Later, as the power amplifier 100 warms up, the switch SW2 may be turned off when the predetermined duration is over, the initial voltage V+ remains unchanged (e.g., 1.12V), the updated voltage V− generated by the sampling circuit 922 may drop (e.g., 1.1V) due to an increase in temperature, and the difference voltage Vdf may not be zero. Since the difference between the initial voltage V+ and the updated voltage V− may be small in value, the differential amplifier 925 may amplify the difference between the initial voltage V+ and the updated voltage V− to produce the difference voltage Vdf with a noticeable magnitude. For example, the initial voltage V+ may be taken at 25 degrees Celsius, the updated voltage V− may be taken at 85 degrees Celsius, the difference between the initial voltage V+ and the updated voltage V− may be 10 mV, the differential amplifier 925 may set to provide a gain of 20, and the difference voltage Vdf output from the differential amplifier 925 may be 200 mV.

The bias signal Sb may be positively correlated to the difference current. The bias signal Sb is then transmitted to the amplifier stage 10 to bias the same. The configuration and operation of other components in the power amplifier 100 are similar to those in the power amplifier 1, and the explanation therefore may be omitted for brevity.

Initially, the initial voltage V+ and the updated voltage V− are sampled when the amplifier stage 10 is not working, and therefore, the initial voltage V+ is equal to the updated voltage V−. During a data transmission, the voltage signal VTD decreases as the amplifier stage 10 starts heating up, the updated voltage V− becomes less than the initial voltage V+, and therefore, the difference voltage Vdf increases. The increasing difference voltage Vdf is converted into an increasing bias signal Sb for biasing the transistor T1, thereby maintaining a substantially constant gain.

The current source 18, the filters 14 and 80, the sample-and-hold circuit 920 and the bias circuit 16 may be fabricated on a first die 92, such as a silicon-on-insulator (SOI) die, and the amplifier stage 10 and the temperature sensor 12 may be fabricated on a second die 90, such as a Gallium Arsenide (GaAs) die, reducing a manufacturing cost, maintaining a substantially constant gain and increasing signal quality of the power amplifier 100. In some embodiments, the voltage-to-current converter 926 may include a first circuit portion and a second circuit portion. The first circuit portion may be implemented on the first die 92, and the second circuit portion may be implemented on the second die 90. The second circuit portion may include a resistor. Since a highly accurate resistor may be provided by the GaAs process, the resistor in the second circuit portion may be a high-precision resistor. The first circuit portion may be coupled to the resistor of the second circuit portion via connection pads on the first die 92 and the second die 90.

While a single amplifier stage 10 is shown in FIGS. 1, 7, 8, 10, multiple amplifier stages may be incorporated to replace the single amplifier stage 10, one or more temperature sensors may be arranged in the proximity to selective amplifier stages and corresponding bias signals may be adjusted to compensate for the self-heating effect. For example, a temperature sensor may be arranged in the proximity to the last amplifier stage and a bias signal may be adjusted to compensate for the self-heating effect.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A power amplifier comprising:
   a first transistor configured to receive a bias signal and amplify a radio frequency (RF) signal;
   a temperature sensor arranged in proximity to the first transistor, and configured to detect a temperature of the first transistor to provide a first voltage signal at a control node accordingly;
   a first filter coupled to the temperature sensor, configured to filter the first voltage signal to generate a filtered voltage, and comprising:
      a variable impedance component configured to adjust an impedance according to a control signal to provide a first impedance in a first interval, and provide a second impedance in a second interval;
   wherein the bias signal is adjusted according to the filtered voltage.

2. The power amplifier of claim 1, further comprising a bias circuit coupled to the first filter, and configured to generate the bias signal according to the filtered voltage.

3. The power amplifier of claim 2, wherein the bias circuit comprises:
   a second transistor comprising a first terminal coupled to a first reference terminal, a second terminal and a control terminal;
   a third transistor comprising a first terminal, a second terminal, and a control terminal coupled to the first terminal of the third transistor; and
   a fourth transistor comprising a first terminal coupled to the second terminal of the third transistor, a second terminal coupled to a second reference terminal, and a control terminal coupled to the first terminal of the fourth transistor.

4. The power amplifier of claim 3, wherein the bias circuit further comprises a first resistor comprising a first terminal coupled to the second terminal of the second transistor, and a second terminal.

5. The power amplifier of claim 4, wherein the bias circuit further comprises a grounding capacitor comprising a first terminal coupled to the second terminal of the first resistor, and a second terminal coupled to the second reference terminal.

6. The power amplifier of claim 3, wherein the bias circuit further comprises a second resistor comprising a first terminal coupled to the control terminal of the second transistor, and a second terminal coupled to the first terminal of the third transistor.

7. The power amplifier of claim 1, further comprising a shunt capacitor arranged between the control node and a first reference terminal.

8. The power amplifier of claim 7, wherein the shunt capacitor and the temperature sensor are coupled in parallel.

9. The power amplifier of claim 7, wherein the shunt capacitor is arranged in proximity to the first transistor.

10. The power amplifier of claim 1, further comprising a bias circuit comprising the temperature sensor, and configured to generate the bias signal according to a variable current.

11. The power amplifier of claim 1, wherein the first filter further comprises:
a first capacitor comprising a first terminal coupled to the variable impedance component, and a second terminal coupled to a first reference terminal.

12. The power amplifier of claim 1, wherein the variable impedance component comprises a first switch coupled in parallel to a resistor.

13. The power amplifier of claim 1, wherein the variable impedance component comprises a first switch coupled in parallel to a inductor.

14. The power amplifier of claim 1, further comprising:
a buffer coupled to the first filter;
a sampling circuit coupled to the buffer and configured to sample the filtered voltage to generate an updated voltage;
a second switch comprising a first terminal coupled to the buffer, and a second terminal;
a capacitor coupled to the second terminal of the second switch and configured to store an initial voltage;
a holding circuit coupled to the second terminal of the second switch;
a differential amplifier coupled to the sampling circuit and the holding circuit, and configured to generate a difference voltage according to a difference between the initial voltage and the updated voltage; and
a voltage-to-current converter coupled between the differential amplifier and a bias circuit, and configured to converter the difference voltage to a difference current.

15. The power amplifier of claim 14, wherein the sampling circuit, the capacitor, the differential amplifier and the bias circuit are fabricated on a first die, and the first transistor is fabricated on a second die.

16. A power amplifier comprising:
a first transistor configured to receive a bias signal and amplify a radio frequency (RF) signal;
a temperature sensor arranged in proximity to the first transistor, and configured to detect a temperature of the first transistor to provide a first voltage signal at a control node accordingly;
a first filter coupled to the temperature sensor and configured to filter the first voltage signal to generate a filtered voltage;
a reference node coupled to a current source or a voltage source; and
a second filter coupled between the reference node and the control node, and configured to filter the first voltage signal;
wherein the bias signal is adjusted according to the filtered voltage.

17. The power amplifier of claim 16, wherein the second filter is configured to filter out noise of the first voltage signal to prevent the noise from affecting the current source or the voltage source.

18. The power amplifier of claim 17, wherein the noise is from an RF signal coupled to the temperature sensor.

19. A power amplifier comprising:
a first transistor configured to receive a bias signal and amplify a radio frequency (RF) signal;
a temperature sensor arranged in proximity to the first transistor, and configured to detect a temperature of the first transistor to provide a first voltage signal at a control node accordingly; and
a first filter coupled to the temperature sensor and configured to filter the first voltage signal to generate a filtered voltage;
wherein the first voltage signal comprises a noise from the temperature sensor, the first filter is configured to filter out the noise to prevent the noise from affecting the bias signal; and
the bias signal is adjusted according to the filtered voltage.

* * * * *